US009787259B2

(12) United States Patent
Jang et al.

(10) Patent No.: US 9,787,259 B2
(45) Date of Patent: Oct. 10, 2017

(54) OUTPHASING POWER AMPLIFIER SIGNAL SPLITTER USING NEXT STAGE INPUT IMPEDANCE AND MULTIPLE BIASING

(71) Applicant: Infineon Technologies AG, Neubiberg (DE)

(72) Inventors: Haedong Jang, San Jose, CA (US); Richard Wilson, Morgan Hill, CA (US); Timothy Canning, Morgan Hill, CA (US); David Seebacher, Villach (AT); Christian Schuberth, Villach Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/934,805

(22) Filed: Nov. 6, 2015

(65) Prior Publication Data

US 2017/0133990 A1    May 11, 2017

(51) Int. Cl.
*H03F 1/07* (2006.01)
*H03F 3/21* (2006.01)
*H03F 3/193* (2006.01)

(52) U.S. Cl.
CPC ........... *H03F 3/211* (2013.01); *H03F 3/193* (2013.01); *H03F 2200/451* (2013.01); *H03F 2203/21103* (2013.01)

(58) Field of Classification Search
CPC ......... H03F 1/07; H03F 1/0288; H03F 1/3252
USPC ..................................... 330/295, 124 R, 302
See application file for complete search history.

(56) References Cited

U.S. PATENT DOCUMENTS

| 5,420,541 | A | * | 5/1995 | Upton | H03F 3/602 330/286 |
| 6,617,929 | B2 | * | 9/2003 | Kim | H03F 1/0288 330/124 R |
| 6,703,897 | B2 | * | 3/2004 | O'Flaherty | H03F 1/0244 330/107 |
| 7,221,219 | B2 | | 5/2007 | Hellberg et al. | |

(Continued)

OTHER PUBLICATIONS

RAAB, Frederick. "Efficiency of Outphasing RF Power-Amplifier Systems." IEEE Transactions on Communications, vol. Com-33, No. 10, Oct. 1985, 6 pages.

(Continued)

*Primary Examiner* — Henry Choe
(74) *Attorney, Agent, or Firm* — Eschweiler & Potashnik, LLC

(57) ABSTRACT

Embodiments relate to outphasing amplifiers and amplification. One example system includes a signal splitter configured to receive an input signal and output a plurality of signals, wherein the signal splitter shifts each of the plurality of signals by a distinct phase based at least in part on a power of the input signal; a plurality of power amplifiers (PAs), each configured to amplify a distinct signal of the plurality of signals to generate a distinct amplified signal; a plurality of input matching networks, each coupled to a distinct PA of the plurality of PAs and configured to transform an input impedance of the coupled PA to an outphasing load condition based on the distinct signal the coupled PA is configured to amplify; and a combiner configured to combine the plurality of distinct amplified signals to generate an amplified input signal.

20 Claims, 17 Drawing Sheets

(56) References Cited

U.S. PATENT DOCUMENTS

| | | | | |
|---|---|---|---|---|
| 7,463,092 B2* | 12/2008 | Kofol | ............... | H03G 3/3036 |
| | | | | 330/129 |
| 7,719,353 B2* | 5/2010 | Nakamura | ............ | H03F 1/0294 |
| | | | | 330/124 R |
| 8,466,746 B2* | 6/2013 | Jeong | ............... | H03F 1/0266 |
| | | | | 330/124 R |
| 8,981,846 B2* | 3/2015 | Wimpenny | ............ | H03F 1/0227 |
| | | | | 330/129 |
| 2014/0159808 A1* | 6/2014 | Acimovic | .............. | G01R 27/02 |
| | | | | 330/2 |
| 2014/0368274 A1* | 12/2014 | Kimura | ............... | H03F 3/193 |
| | | | | 330/295 |
| 2015/0180428 A1* | 6/2015 | Pham | .................. | H03F 3/211 |
| | | | | 330/295 |
| 2015/0222233 A1* | 8/2015 | Kimura | ............... | H03F 1/0205 |
| | | | | 330/295 |

OTHER PUBLICATIONS

Barton, Taylor et al. "Transmission-Line-Based Multi-Way Lossless Power Combining and Outphasing System." IEEE, 2014, 4 pages.
Barton, Taylor et al. "An RF-input Outphasing Power Amplifier with RF Signal Decomposition Network." 4 pages.

* cited by examiner

OUTPHASING POWER AMPLIFIER SIGNAL SPLITTER USING NEXT STAGE INPUT IMPEDANCE AND MULTIPLE BIASING

FIELD

The present disclosure relates to outphasing power amplifiers with reduced power consumption and complexity, while achieving higher efficiency.

BACKGROUND

High peak-to-average ratio signals for high data-rate communication require power amplifiers to operate in a wide back-off mode, resulting in low average efficiency. Outphasing power amplifiers (PAs) use multiple amplifiers to provide output power in a linear and efficient way at the back-off condition when it is used with non-isolating power combiners.

One example of a non-isolating power combiner is the Chireix combiner. FIG. 1 illustrates two variations of an outphasing power amplifier (PA) with a Chireix combiner and input phase modulator. At 100 is a Chireix combiner using two quarter wave length transmission lines (2-way) and shunt reactive elements. These shunt elements can be replaced by transmission lines of different lengths with similar functionality as shown in the Chireix combiner at 110.

Another conventional example of an outphasing PA employs four power amplifiers with a 4-way power combiner that results in flatter efficiency over a wider back-off operation range. When these amplifiers are used in an outphasing mode with a combiner requires an input signal splitter or phase modulator such as those depicted in the Chireix combiners of FIG. 1. These signal splitters have been conventionally implemented using digital signal processing (DSP), up-converting a baseband signal to outphased RF signals.

DETAILED DESCRIPTION

Figure 1:
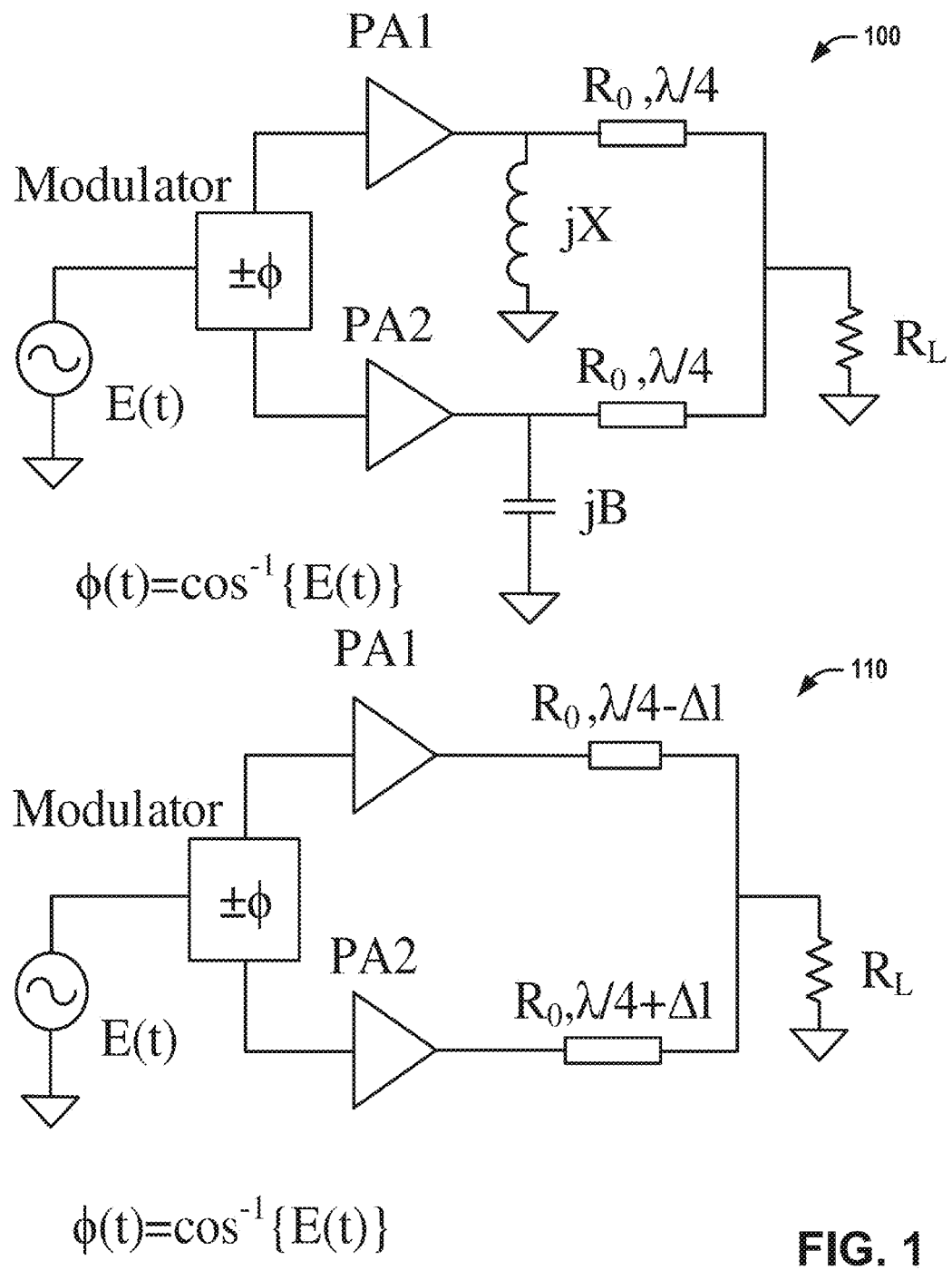
FIG. 1 is a circuit diagram illustrating two variations of an outphasing power amplifier (PA) with a Chireix combiner and input phase modulator.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Conventional outphasing amplifiers that use digital signal processing (DSP) for up-conversion of baseband signals to out-phased RF signals introduce complexity to outphasing power amplifier (PA) design and also restrict adoption of such outphasing amplifiers into existing systems as drop-in PAs. These conventional outphasing PAs cannot be easily replaced with pre-existing power amplifiers and require new transmitter system design to accommodate the outphasing PA. Additionally, the system complexity also increases as the number of power amplifiers used increases, for example, when employing N-way outphasing amplifiers.

Figure 2:
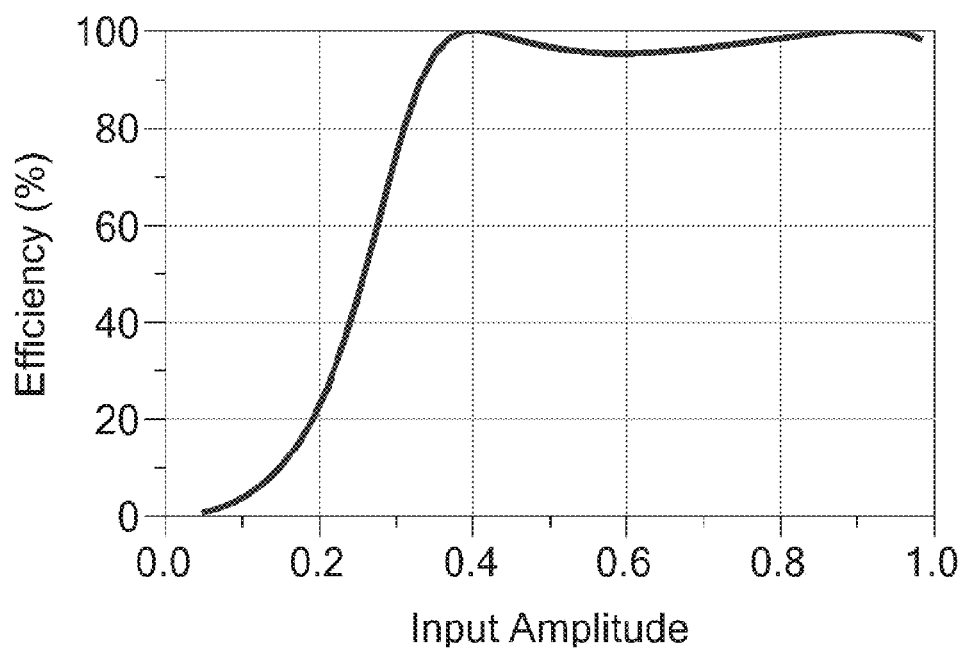
FIG. 2 is a graph illustrating efficiency versus input signal amplitude for an ideal Chireix combiner.

Another issue with conventional outphasing PAs is that the efficiency of the non-isolating outphasing combiner versus power has the desirable flat response only for the high power region (from peak power to the designed back-off power level) and quickly drops in the low power region (and is even lower than conventional fixed-load power amplifiers), as shown in FIG. 2, illustrating the combiner efficiency against input signal amplitude for an ideal Chireix combiner.

Figure 3:
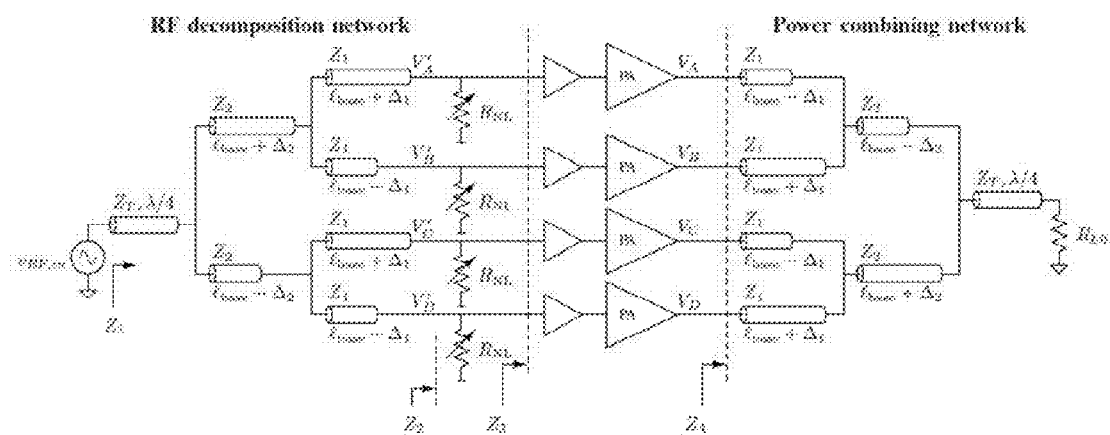
FIG. 3 is a circuit diagram illustrating an outphasing power amplifier (PA) with a 4-way output power combiner and input signal splitter employing nonlinear resistors.

Referring to FIG. 3, illustrated is a conventional outphasing PA with a 4-way output combiner and input signal splitter. The signal splitter in FIG. 3 was implemented in a digital domain using IQ-modulators which up-convert baseband signals into RF signals with corresponding phases. The high complexity of digital control circuits was removed via the use of the analog signal splitter shown in FIG. 3. The output combiner was reused as a signal splitter with added nonlinear resistors for the phase splitting to achieve outphasing.

Figure 4A:
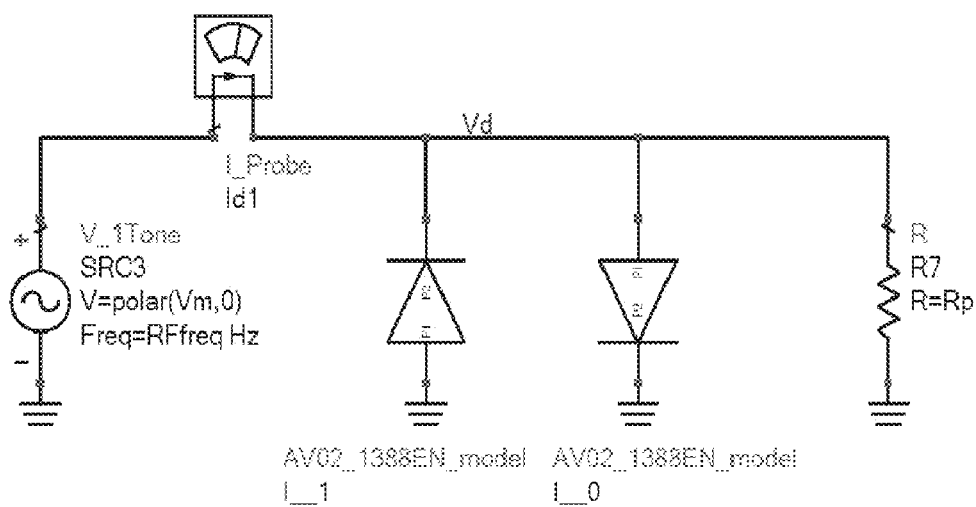
FIG. 4A is a circuit diagram illustrating a nonlinear resistor implementation employed in the outphasing PA of FIG. 3.
Figure 4B:
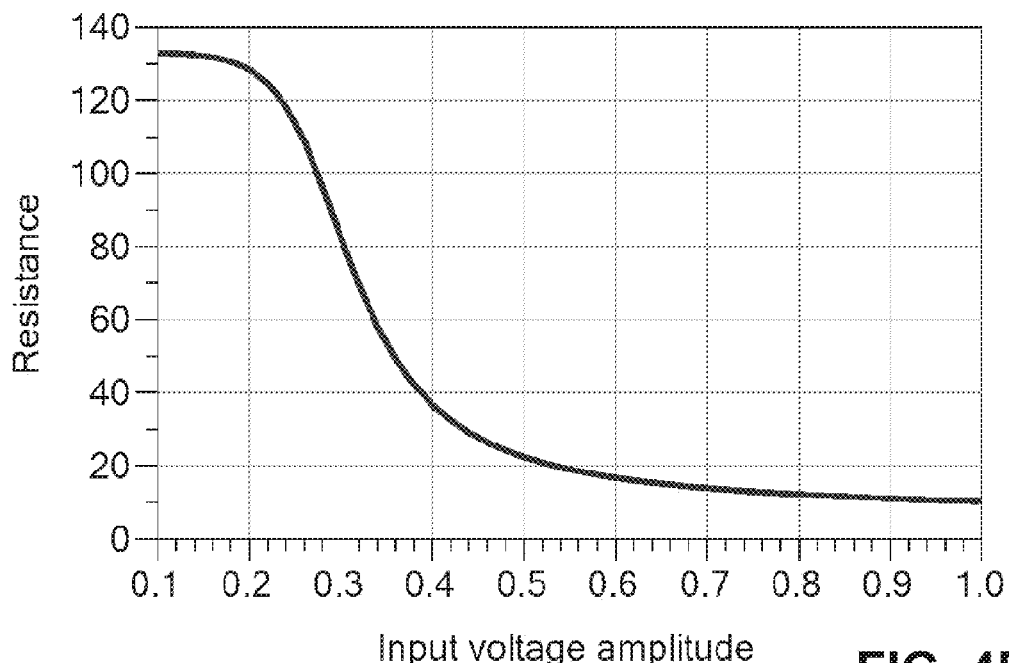
FIG. 4B is a graph illustrating the simulated nonlinear resistance of the nonlinear resistor implementation of FIG. 4A.

The output power combiner in FIG. 3 presents varied loads to power amplifiers versus output power during outphasing operation. This combiner is used in a reverse way at the input. The input signals are split into different phases when the outputs of the splitter are loaded with varied loads. Nonlinear variable resistors ($R_{NL}$) are introduced at the output of the splitter to produce signal splitting for power amplifiers. In this configuration, as illustrated in FIG. 4A, the nonlinear variable resistors were implemented using anti-parallel diodes and a resistor. FIG. 4B shows the simulated nonlinear resistance variation for the outphasing PA of FIG. 3.

At low power, the diodes are off and the resistance is constant, so in this power region the system of FIG. 3 behaves like conventional fixed-load power amplifiers. Thus, it addresses the issue of low efficiency at low power region. Conventionally, at low power, the phases were fixed and operated as normal power amplifiers using digital control at the cost of complexity. When the voltages across the diodes are above on-voltage ($V_{on}$), they conduct currents ($I_d$) resulting in nonlinear variable resistance and operate in an outphasing mode. However, one drawback to this method is that the diodes and the resistor consume power ($V_{on} \times I_d + I_R^2 R_P$) when they are on. Thus, lower splitter gain and power inefficiency are expected. Another drawback is that these anti-parallel diodes add complexity in design by themselves. Additionally, the nonlinear resistance variation may not be suitable for 2-way outphasing power amplifiers, which have higher reactive load variation than 4-way implementations or require nonlinear complex impedance variation rather than resistive variation only. The unnecessary power consumption of the outphasing PA of FIG. 3 can lead to lower gain and low efficiency, with higher complexity and larger form factor than embodiments discussed herein.

Embodiments disclosed herein relate to outphasing power amplifiers with reduced complexity and power consumption, while providing higher efficiency. Systems, methods, and apparatuses discussed herein can include signal splitters that can replace complex digital signal splitters for 4-way outphasing amplifiers as well as 2-way. Embodiments discussed herein can also be used for complex Chireix-Doherty composite amplifier implementation with significantly reduced complexity. Conventionally, outphasing amplifiers have been less frequently chosen by power amplifier designers due to increased complexity compared to Doherty amplifiers. However, outphasing PAs and signal splitters discussed herein have reduced complexity and power consumption, and can be employed in a variety of applications for flatter and wider back-off efficiency, with higher average efficiency.

In contrast to conventional outphasing PAs, embodiments discussed herein do not require digital signal processing. Thus, pre-existing PAs can be replaced with amplifiers discussed herein as a drop-in PA, with less complexity and potentially smaller form factor, while maintaining at least the same performance. Additionally, signal splitter aspects discussed herein can simplify prior analog signal splitters, which have required nonlinear or active components with higher complexity such as in Chireix-Doherty composite amplifiers or the 4-way outphasing PA of FIG. 3.

In aspects, input matching networks of power amplifiers can be configured to transform the input impedance variation of devices versus power to the necessary load variation of signal splitters for outphasing operation. Additionally, in various embodiments, multiple biasing can be selected by adjusting the gate bias voltage of at least some of the PAs employed in such embodiments. Outphasing amplifiers have conventionally had degraded efficiency at low power range. In aspects, to recover efficiency at the low power region, multiple gate biasing can be applied. As one example, a first PA can be biased at class-AB operation, while a second PA can be biased at class-C operation condition.

Figure 5:
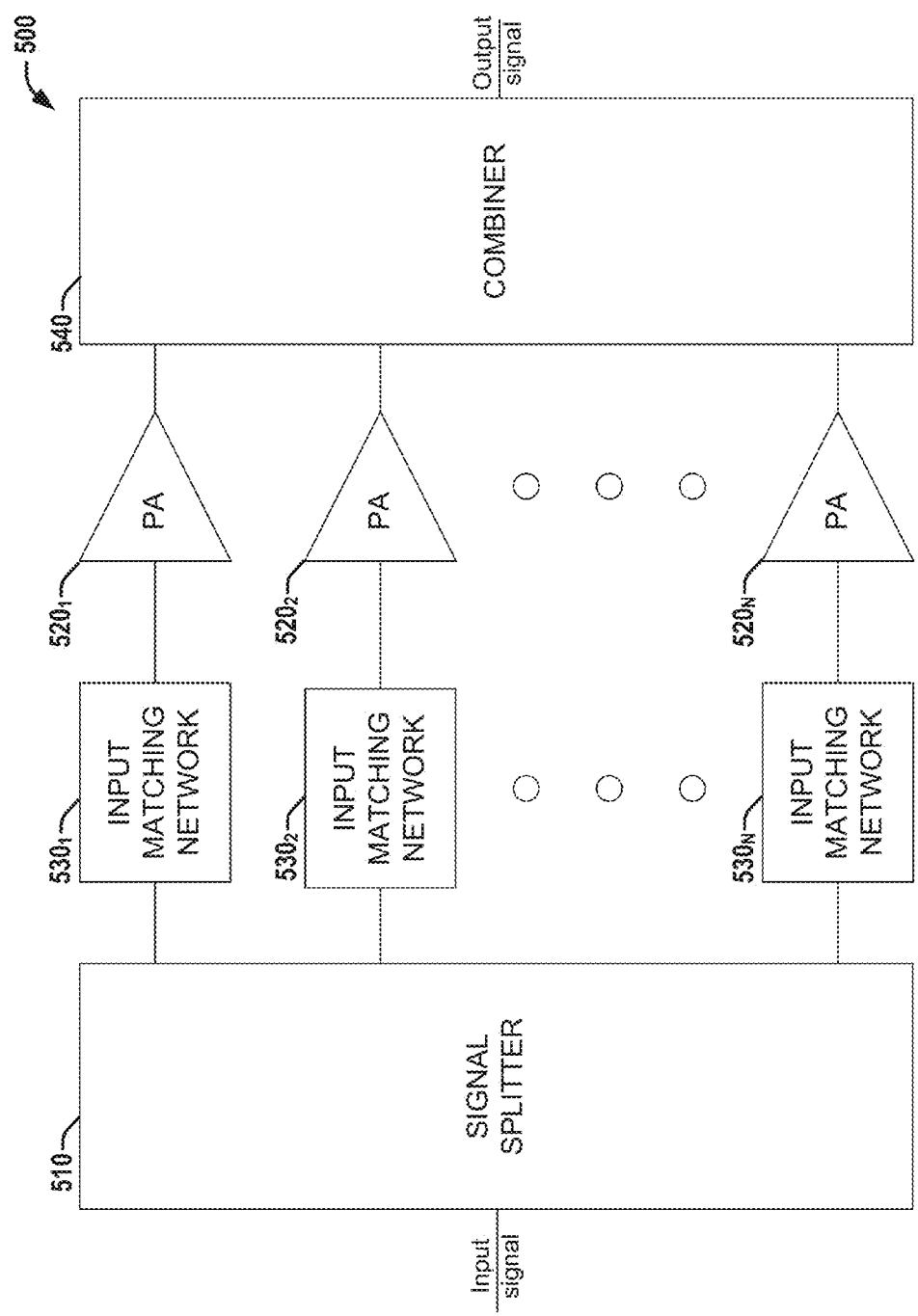
FIG. 5 is a block diagram illustrating a system that facilitates outphasing amplification according to various aspects described herein.

Referring to FIG. 5, illustrated is a block diagram of a system 500 that facilitates outphasing power amplification in accordance with various aspects discussed herein. System 500 can include a signal splitter 510, a plurality of power amplifiers $520_i$, a plurality of input matching networks $530_i$, and a combiner 540.

Signal splitter 510 can receive an input data signal (e.g., modulated input RF signal, etc.) and split that signal into a plurality of distinct data signals, each of which can be shifted by a distinct phase that can be based at least in part on the input data signal. Signal splitter 510 can output the plurality of different data signals along a plurality of distinct signal paths. Signal splitter 510 can shift the distinct data signals by different phases through any of a variety of means, such as via shunt reactive elements on distinct signal paths, different lengths of transmission lines on distinct signal paths, combinations thereof, etc.

Each of the plurality of power amplifiers $520_i$ can be along one of the plurality of distinct signal paths, and can receive and amplify one of the distinct data signals, outputting an amplified version of that distinct data signal. In various embodiments, different numbers of power amplifiers $520_i$ can be employed in system 500, such as two power amplifiers, three, four, or substantially any number of power amplifiers. Each of the power amplifiers $520_i$ can be of any of a variety of device types (e.g., gallium nitride (GaN), laterally diffused metal oxide semiconductor (LDMOS), etc.), and the plurality of power amplifiers $520_i$ can each be of the same device type, or can be of two or more different device types. As discussed in greater detail below, the device type of each power amplifier $520_i$ can affect the input impedance of that power amplifier $520_i$.

In various aspects, multiple gate biasing can be employed with the plurality of power amplifiers $520_i$, which can provide improved efficiency at low power. In such aspects, at least one of the PAs $520_i$ can have a first gate bias, and at least one of the PAs $520_i$ can have a second distinct gate bias (in some aspects, further distinct gate biases can also be used). Thus, in some embodiments, when the power of the input data signal is below some threshold power (which can depend on the associated gate bias(es)), one or more (e.g., all but one, etc.) of the PAs $520_i$ (e.g., those with the second gate bias, etc.) can be deactivated or remain inactive. As one example, in a system with two PAs $520_i$, a first PA $520_1$ can be biased as a class-AB PA, and a second PA $520_2$ can be biased as a class-C PA, such that below a certain threshold power of the input data signal, the second PA $520_2$ can deactivate or remain inactive. Thus, below the threshold power, outphasing operation need not be employed, and low power efficiency can be increased.

Each of the plurality of input matching networks $530_i$ can be on a distinct signal path and coupled to the distinct PA $520_i$ of the plurality of PAs $520_i$ on that signal path. Each input matching network $530_i$ can transform the input impedance of the coupled PA $520_i$ to an outphasing load condition based on the distinct data signal on that signal path (the distinct data signal the coupled PA $520_i$ amplifies).

Combiner 540 can receive the plurality of distinct amplified data signals that have been amplified by the plurality of PAs $520_i$, and combine those distinct amplified data signals by shifting their phases to generate an amplified version of the input data signal. Combiner 540 can shift the phases of the distinct amplified data signals by different phases through any of a variety of means, such as via shunt reactive elements on distinct signal paths, different lengths of transmission lines on distinct signal paths, combinations thereof, etc. Additionally, combiner 540 and signal splitter 510 can employ similar or distinct techniques for shifting the phases of the distinct data signals and distinct amplified data signals, respectively.

As discussed above, each input matching network $530_i$ transforms impedances from the input impedance of the associated PA $520_i$ to the outphasing load conditions at the signal splitter 510. If the input impedance of the associated PA $520_i$ is unknown, the input matching network $530_i$ cannot be designed. That input impedance can be identified as follows. First, for each signal path, the impedance can be measured at the input of combiner when in the outphasing condition, wherein signals with distinct phases versus power level are applied to the combiner and combined into one output signals versus power. Second, the impedances determined at the inputs of combiner when in the outphasing condition can be applied to the respective outputs of the PAs $520_i$ in the outphasing condition, thus the input powers of the PAs $520_i$ is varied based on the impedance variation measured at the respective input of combiner when in the outphasing condition as a function of power. In various aspects, the PAs $520_i$ can be linear or nonlinear with a certain gain, therefore, the input powers can be adjusted accordingly to maintain the intended outphasing condition at the combiner 540. Third, input impedance variation at the input of each PA $520_i$ can be measured as a function of power. From this input impedance variation, the associated input matching network $530_i$ can be designed.

Non-ideal devices such as gallium nitride (GaN), etc., or amplifiers have inherent input impedance variation versus power and loads. In various embodiments, this impedance variation can be exploited to achieve the load variation to the splitter to enable outphasing operation. This technique can also use the output combiner as an input signal splitter. However, aspects discussed herein can replace the anti-parallel diodes of FIG. 3, using the inherent input impedance variation of devices with an input matching network configured to provide load variation for signal splitting. Therefore, the power consumption of the diodes in the system of FIG. 3 is eliminated. The impedance transformation of the input impedance variation to outphasing load condition at the splitter can be absorbed into the input matching networks of the power amplifiers, which are typically included in power amplifier designs. thus, the complexity of using anti-parallel diodes is removed and the signal splitter can be significantly simplified according to various aspects discussed herein. The input impedance variations of devices are a function of output power and load and are not necessarily resistive. Thus, with a proper impedance transformation, the load variation is not limited to resistive variation. Thus the techniques employed herein can be used for a wider range of applications, for example, 2-way and N-way (e.g., 4-way, etc.) outphasing power amplifiers which may require resistive as well as complex impedance variation.

Furthermore, the low efficiency at the low power region can be addressed using multiple biasing, as discussed herein. The gate biases of amplifiers can be different, and some or all of the devices can be turned on, depending on whether operating in low or high power modes. This technique need not be limited to GaN devices, and can employed in a range of devices where the input impedance variation of the device is sufficiently large.

Figure 6:
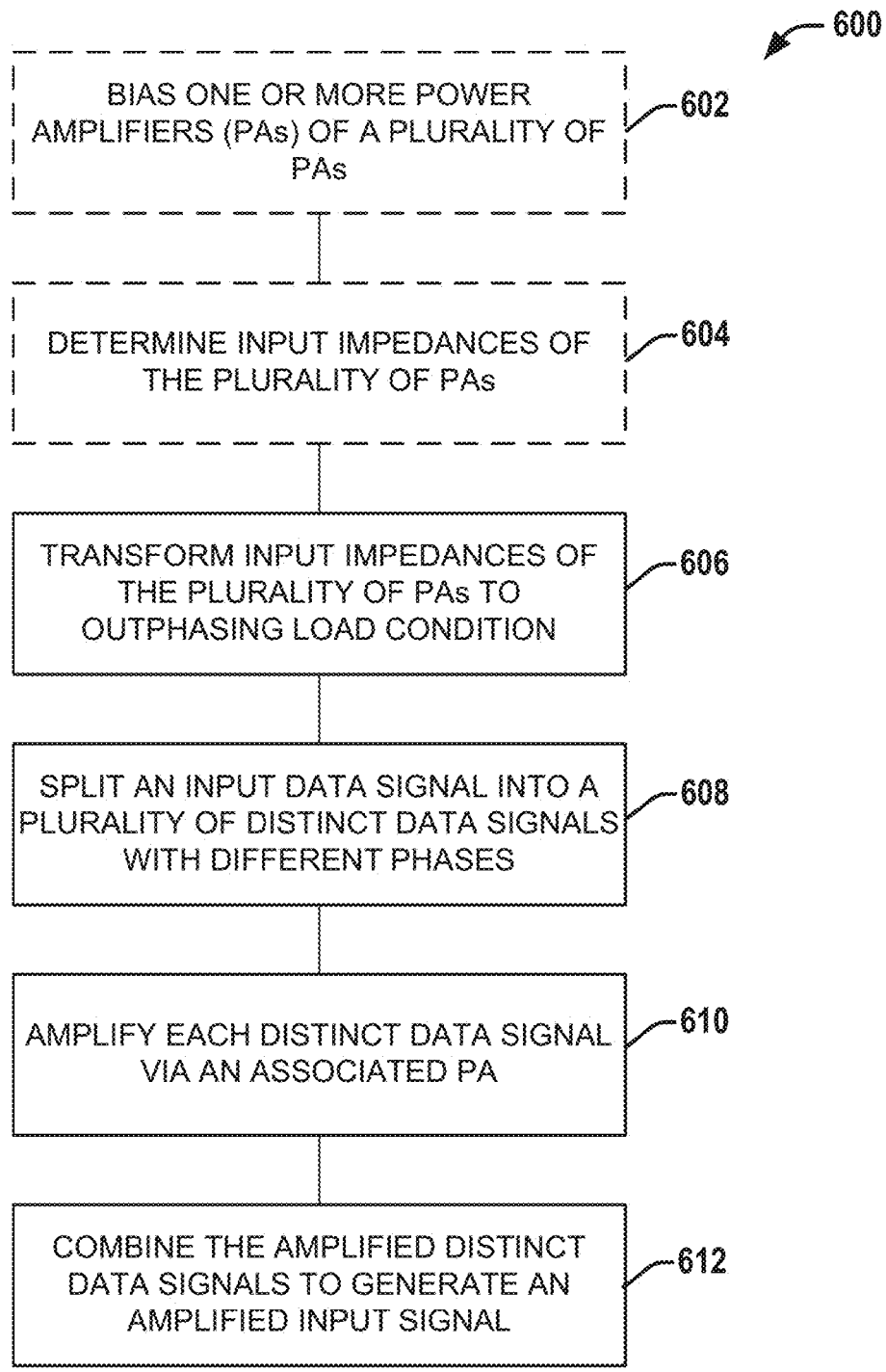
FIG. 6 is a flow diagram illustrating a method that facilitates outphasing amplification according to various aspects described herein.

Referring to FIG. 6, illustrated is a flow diagram of a method 600 that can facilitate amplification of an input data signal.

At 602, optionally, one or more PAs of a plurality of PAs can be biased, and in various aspects, multiple distinct biases can be applied to different PAs of the plurality of PAs. For example, at least a first set of one or more PAs can be biased with a first bias (e.g., biased as a class-AB PA), at least a second set of one or more PAs can be biased with a second bias (e.g., biased as a class-C PA), etc.

At 604, optionally, the input impedances of the plurality of PAs can be determined. This can involve the technique discussed above. Thus, for each PA, an associated input impedance at the combiner in connection with the outphasing load condition can be measured, the measured combiner input impedance can be applied to the output of the PA, and the input impedance of the PA based on the applied combiner input impedance can be measured.

At 606, the input impedances of each PA of the plurality of PAs can be transformed to an outphasing load condition, such as via an input matching network such as input matching network 530$_i$.

At 608, the input data signal can be split into a plurality of distinct data signals, by shifting each of the distinct data signals by a different phase, and providing each via a distinct signal path (e.g., a distinct output of a signal splitter such as signal splitter 510, etc.). Splitting can be accomplished via shunt reactive elements, varying transmission line lengths, a combination thereof, etc.

At 610, each of the distinct data signals can be amplified by an associated PA to generate an amplified version of the distinct data signal. If distinct biases were applied to different PAs at 602, depending on the power of the input data signal, it may be low enough (e.g., below a threshold power, etc.) that only some of the plurality of PAs (e.g., those with the first bias) will amplify respective distinct data signals, while the others are deactivated or remain inactive.

At 612, the amplified distinct data signals can be combined (e.g., via a combiner that phase shifts the amplified distinct data signals to combine them) to generate an amplified version of the input data signal. As with the splitting of the input data signal, the combining can be accomplished via shunt reactive elements, varying transmission line lengths, combinations thereof, etc.

Figure 7:
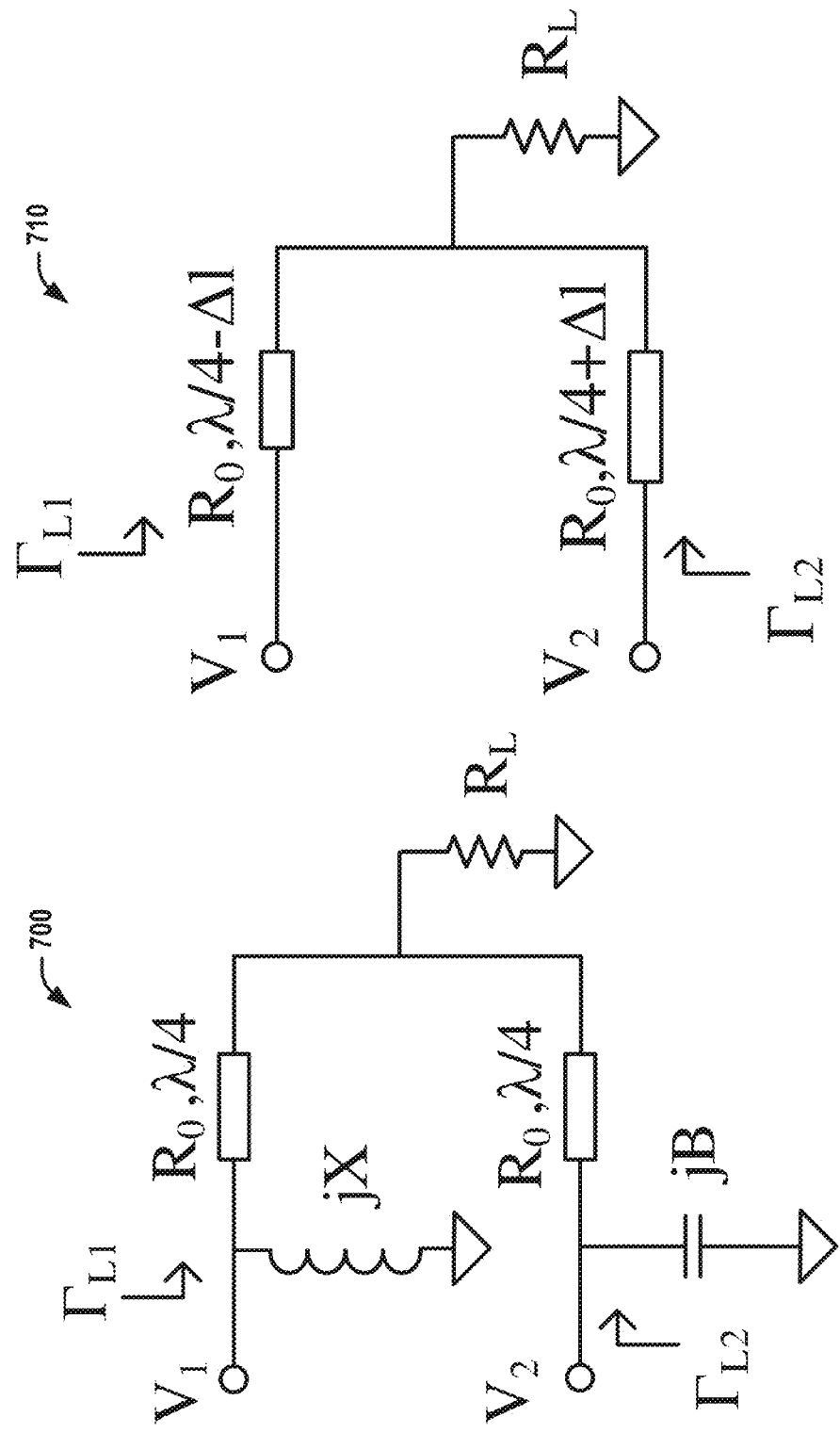
FIG. 7 is a pair of circuit diagrams illustrating two outphasing combiners, one with shunt reactive elements, and one implemented via transmission lines only.

Referring to FIG. 7, illustrated is a pair of conventional outphasing combiners, showing a Chireix combiner at 700, and an alternative version employing transmission lines only at 710. Chireix combiners have quarter wave length transformers with shunt reactive elements for proper backoff operation. As can be seen at 710, the shunt elements of the Chireix combiner can be effectively represented by using different lengths of transmission lines.

Figure 8A:
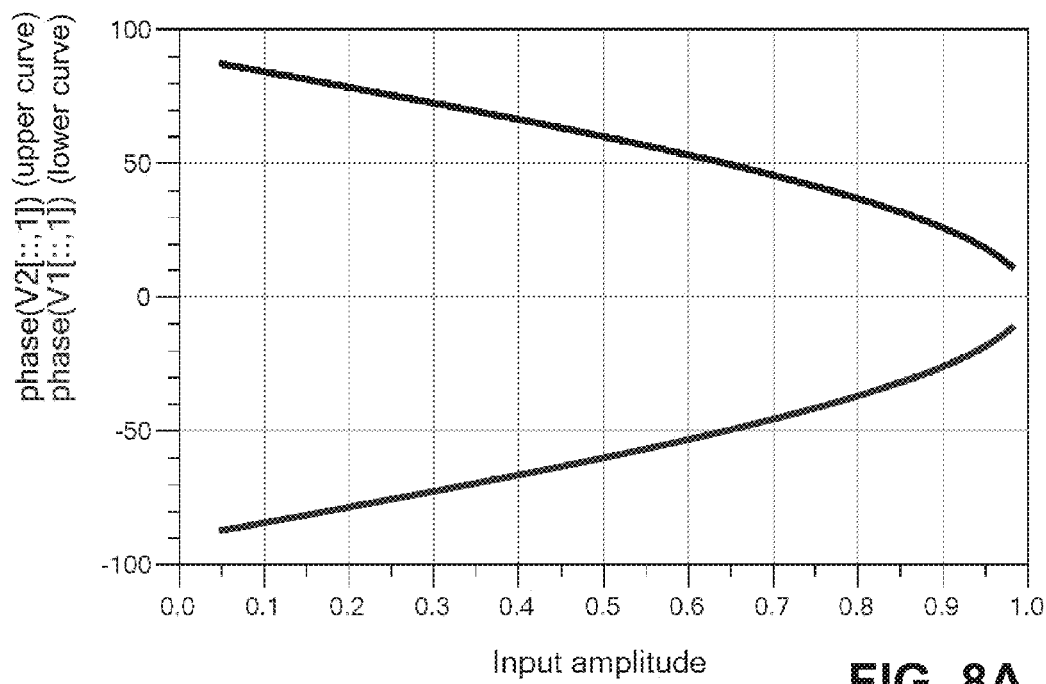
FIG. 8A is a graph of voltage phases as a function of input amplitude at the input of a Chireix combiner.
Figure 8B:
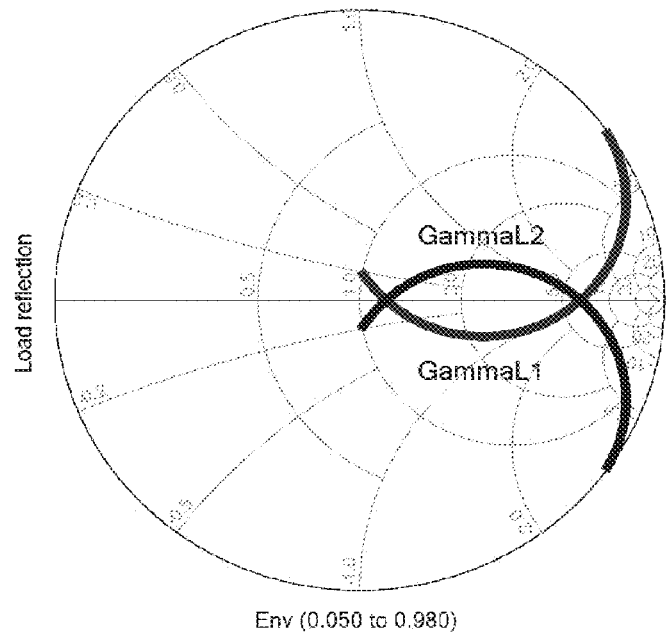
FIG. 8B is a Smith chart showing the loads presented to a power amplifier output corresponding to the signals in FIG. 8A.

Referring to FIG. 8A, illustrated are typical phases of two voltage signals applied to the combiner inputs versus input signal amplitude. With these signals, FIG. 8B illustrates the load variation seen at the input of the combiner which is typically presented to power amplifiers where the smith chart is normalized to 50 Ohm. The ideal efficiency of the combiners of FIG. 7 versus input amplitude is depicted in FIG. 2, discussed above. The efficiency is maintained at high level from the peak amplitude to the back-off second peak efficiency point and rapidly decreases as input amplitude decreases.

Figure 9:
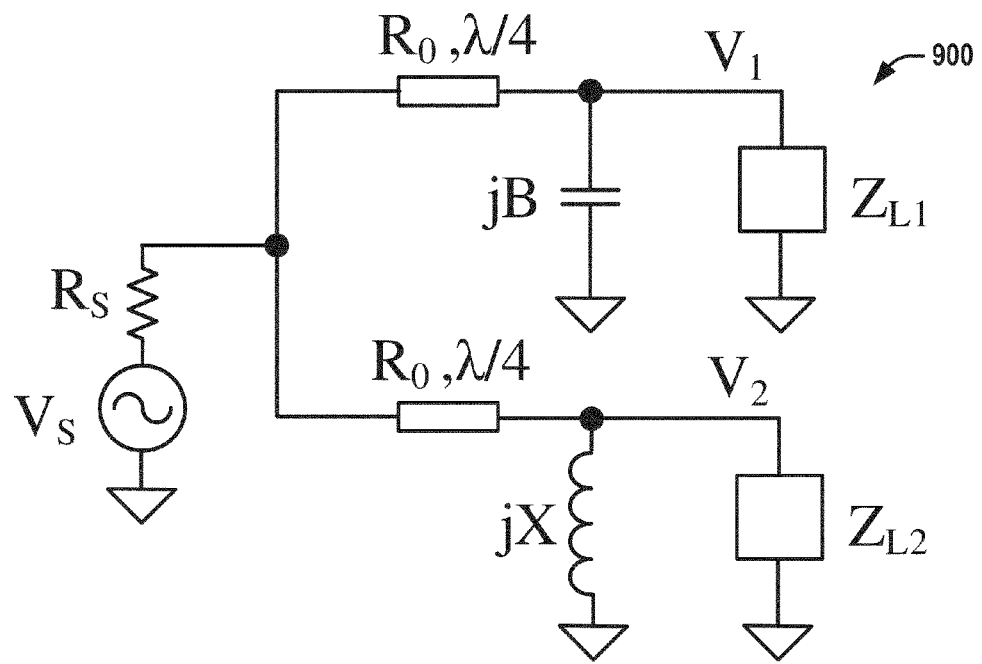
FIG. 9 is a pair of circuit diagrams illustrating two signal splitters, one with shunt reactive elements, and one implemented via transmission lines only.
Figure 9:
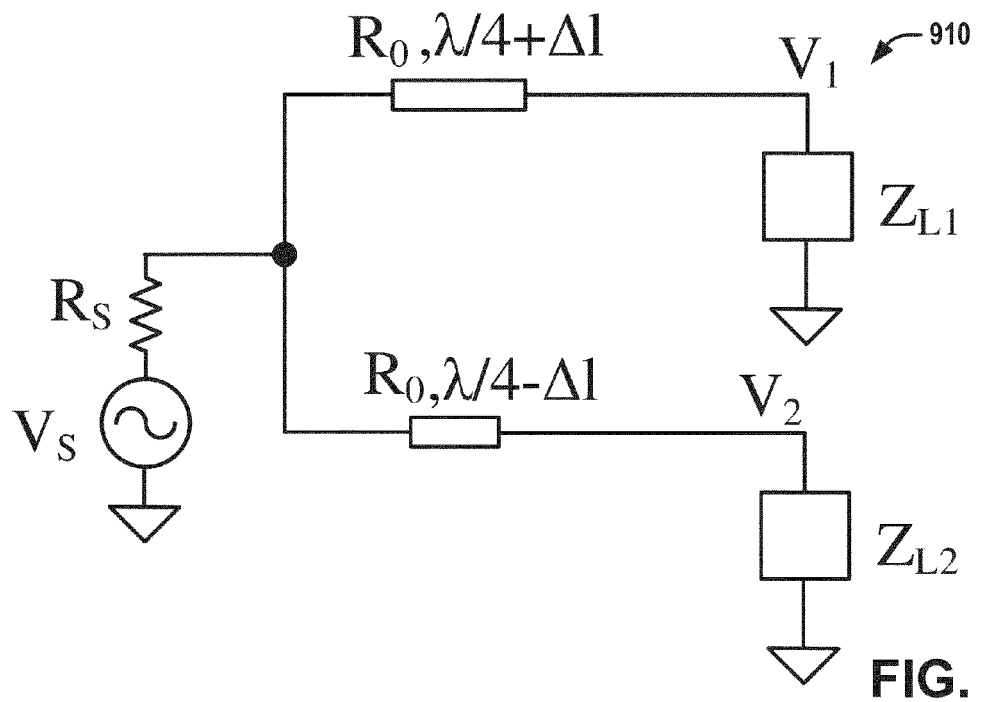

The combiners in FIG. 7 can be configured as signal splitters, as discussed above. The combiner can be reversed, the output can be connected to signal sources, and the inputs can be connected to power amplifier inputs with proper load variation. FIG. 9 illustrates two example outphasing signal splitters 900 and 910 according to various aspects discussed herein. The load variation applied to the output of signal splitters are the same as the load variation of combiners of FIG. 8B. Note that the reactive elements connected at the V1 and V2 nodes in signal splitters can be switched between the two nodes different from the combiner as shown at 900. The transmission line length differences are reversed as well in 910. Otherwise, the shunt reactive elements and the transmission line lengths can be kept the same when the loads are complex conjugated for the same operation.

Figure 10:
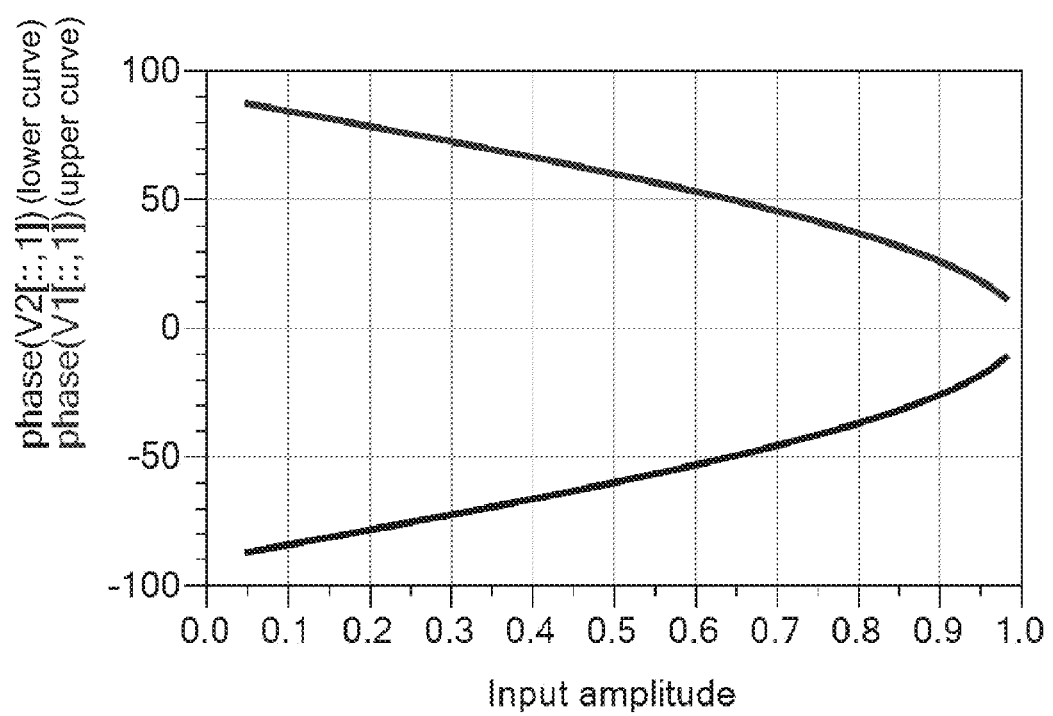
FIG. 10 is a graph of voltage phases resulting from the signal splitters of FIG. 9.

Referring to FIG. 10, shows split signal phases at the nodes V1 and V2 versus source signal amplitude with appropriate load variation at the output of signal splitter. In the example, shown in R0=70.7Ω, B=0.007 and X=1/B in FIG. 9 at 900 and R0=82.6Ω, ΔI=31° in FIG. 9 at 910, with Rs=50Ω. These parameters can be selected in particular embodiments for a designed back-off operation of power amplifiers. $Z_{L1}$ and $Z_{L2}$ are varied-loads of Chireix combiner.

Although the specific examples considered in FIGS. 9 and 10 have two PAs, techniques discussed herein need not be limited to two-way outphasing amplifiers. Four-way and N-way outphasing splitters can be employed in various embodiments. The required load variation for signal split in the conventional outphasing amplifier of FIG. 3, however, was implemented using anti-parallel diodes with a parallel resistor, as shown in FIG. 4A. Those diodes and resistor consume power, resulting in lower gain and added complexity. In various embodiments disclosed herein, those diodes and the resistor can be removed by using input impedance variation of realistic devices (e.g., GaN devices, LDMOS devices, etc.).

Figure 11:
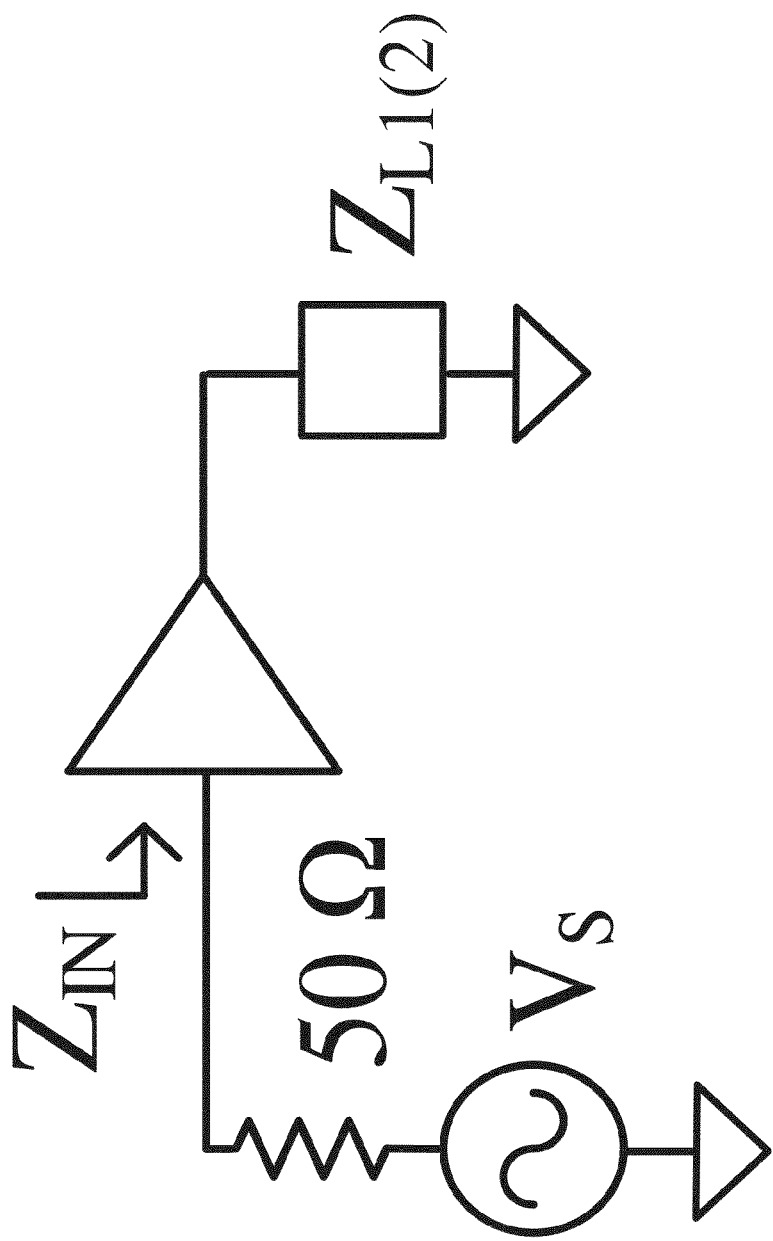
FIG. 11 is an example circuit diagram showing input impedance variation for a gallium nitride (GaN) PA with Chireix combiner loads, according to various aspects disclosed herein.
Figure 12:
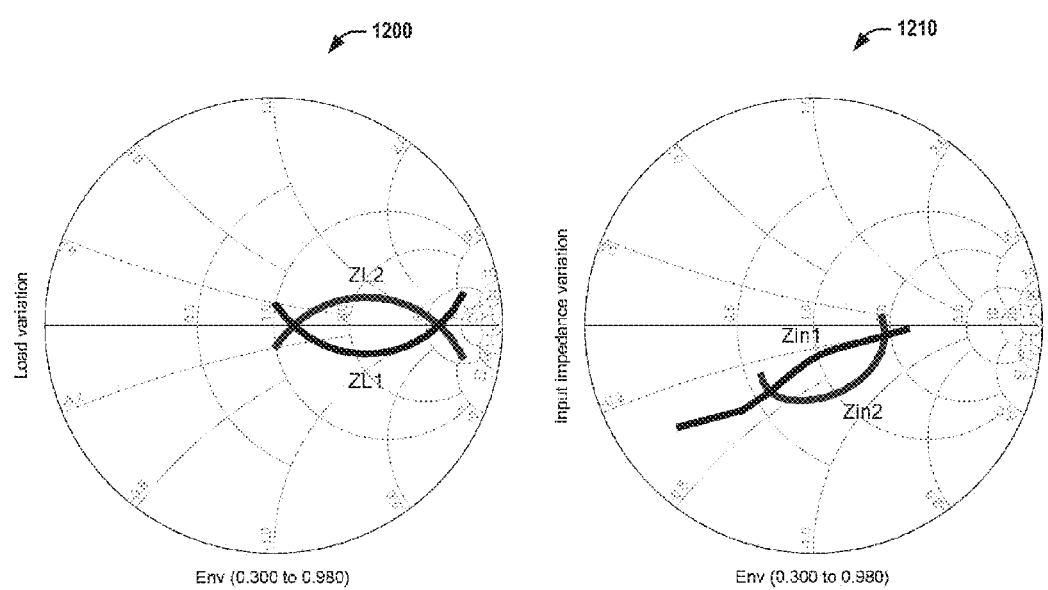
FIG. 12 is a pair of Smith charts showing the applied load impedance variations and corresponding input impedance variations as a function of power for the PA of FIG. 11.

Referring to FIG. 11, illustrated is a circuit diagram of an example power amplifier designed using a GaN device that can be loaded with the varied loads of a 2-way outphasing combiner. The loads $Z_{L1}$ and $Z_{L2}$, which are variable loads, mimic the load variation presented to power amplifiers by outphasing combiners, as illustrated in FIG. 12 at 1200. The input impedance of the power amplifier is function of output power and loads as $Z_{in}$=f($P_{out}$, $Z_L(P_{out})$), where $Z_{in}$, $P_{out}$ and $Z_L$ are input impedance, output power and the load presented to the power amplifier, respectively. All these parameters depend on the design frequency (not explicitly shown here), and it is assumed that all the load variations and matching networks have been properly designed for the specific design frequency. Also note that the output matching of the power amplifier is properly phased in such a way that the output power is decreased when the load is increased. However, this load variation direction as a function of power also can be reversed in various embodiments.

Figure 13:
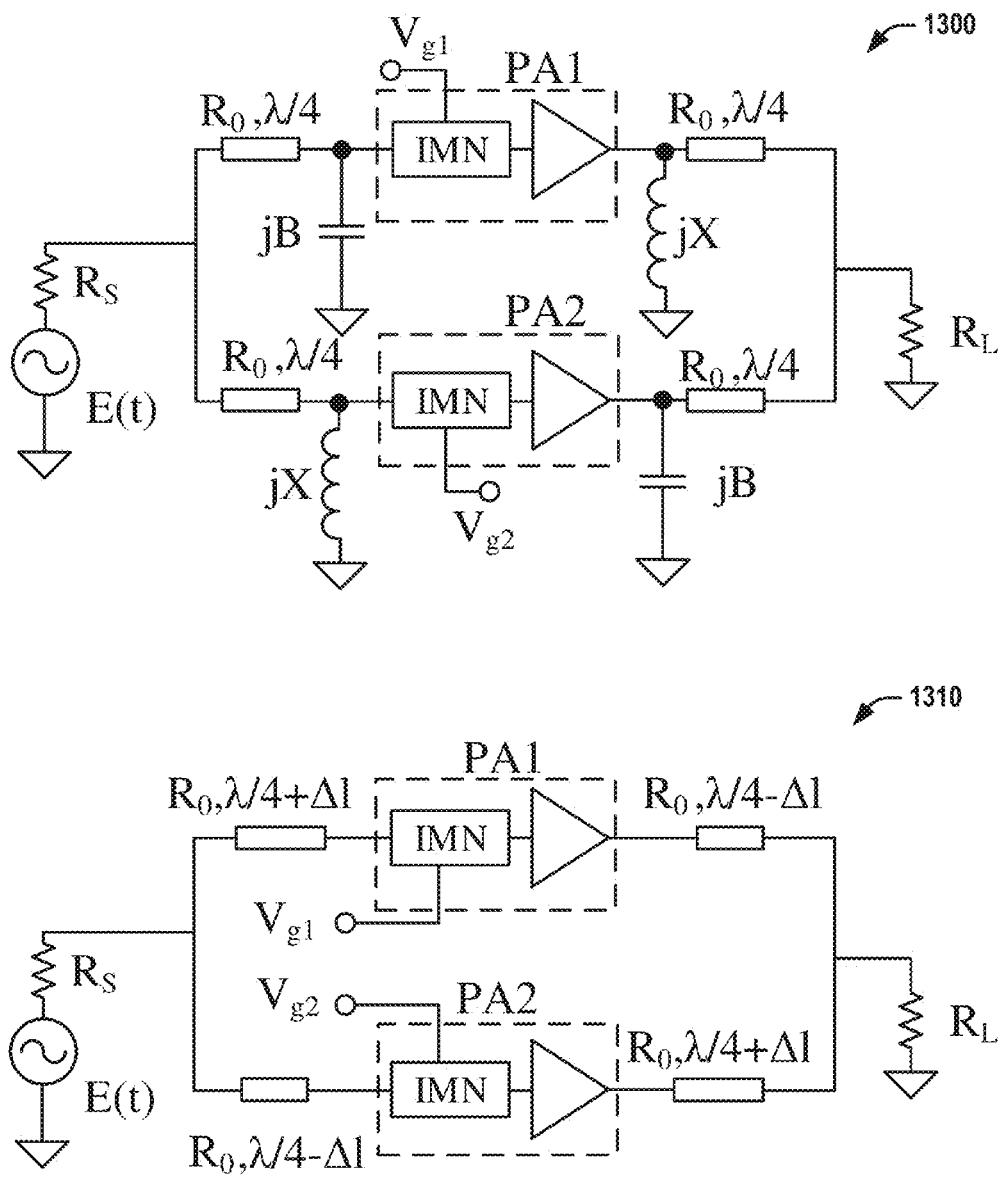
FIG. 13 is a pair of circuit diagrams of different example embodiments of outphasing amplifiers according to various aspects disclosed herein.

FIG. 12 illustrates the input impedance variation for the two different load variation cases ($Z_{L1}$, $Z_{L2}$) of 1200 at 1210. These input impedance variations can be effectively transformed to the necessary impedance variation of the splitter by a proper impedance transformer as shown in FIG. 13, illustrating two different example embodiments of outphasing amplifiers according to various aspects discussed herein, with an example embodiment employing shunt elements at 130, and an example transmission line only embodiment at 1310. The input matching network (IMN) can be implemented in a variety of ways, for example, using lumped elements or transmission lines with single or multiple sections, etc.

As discussed above, in various aspects, multiple biasing can be employed. As discussed above in connection with FIG. 2, the efficiency of outphasing combiners quickly degrades in the low power operation range. The system of FIG. 3 attempted to address this via nonlinear impedance variation using the on and off conditions of diodes; however, this resulted in increased complexity and power consumption. In various embodiments, at least some PAs can have different biases from one another to address the low power efficiency issues. In one example with two PAs, one amplifier can be biased as a class-AB mode PA, while the other amplifier can be biased for class-C operation mode. With this varied bias in various embodiments, the gain of a particular power amplifier can be varied and can be compensated for by using various methods such as adjusting the signal split ratio, using different device sizing, etc.

Figure 14:
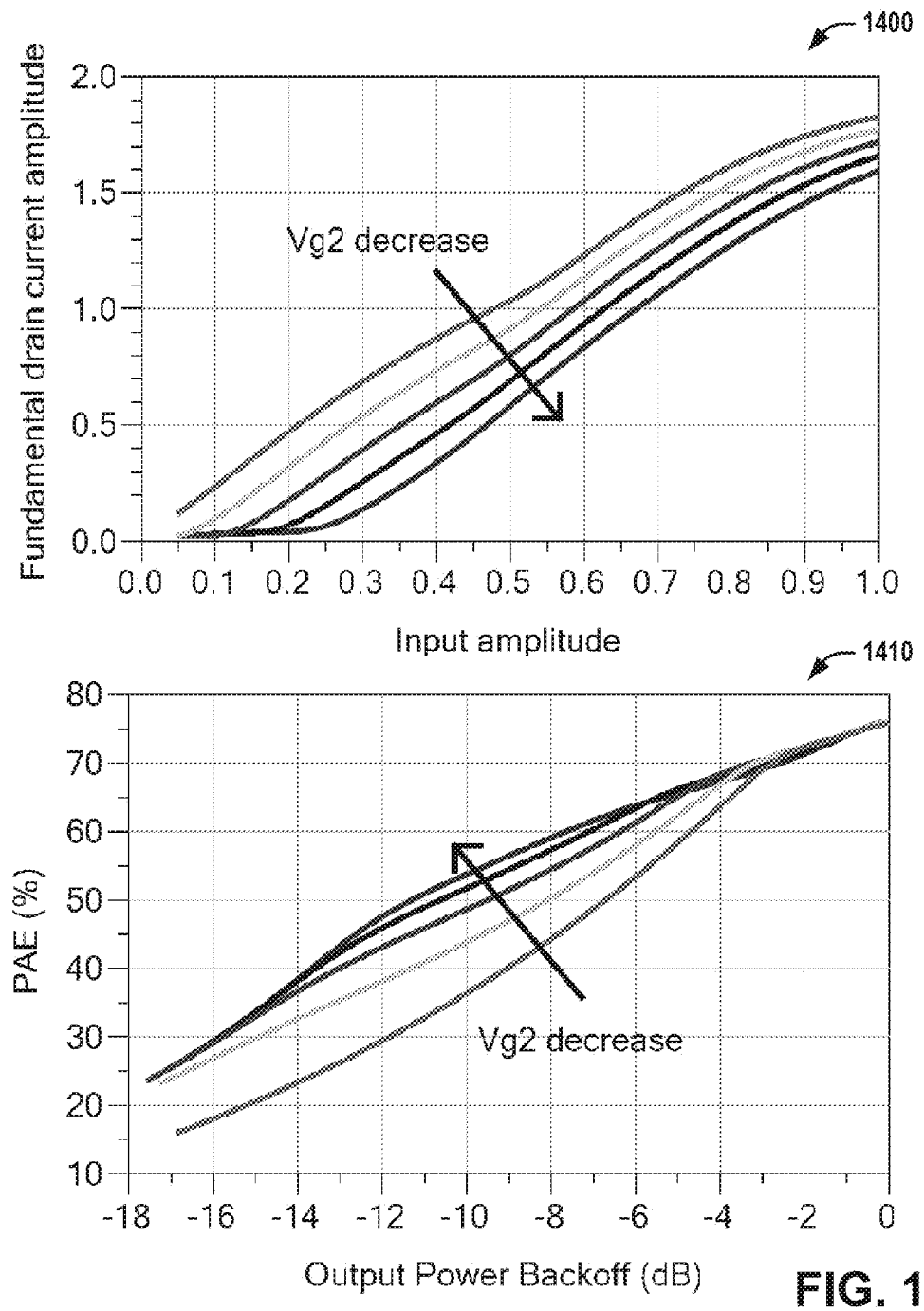
FIG. 14 is a pair of graphs illustrating the fundamental drain current as a function of input amplitude and power added efficiency as a function of output power backoff for various gate biases, according to various aspects disclosed herein.

Referring to FIG. 14, illustrated are graphs of the fundamental drain current with various gate biases ($V_{g2}$) at 1400 and the corresponding power added efficiency recovery of the outphasing operation in the low power range at 1410. As can be seen in 1400, the turn-on time of devices can be controlled via selection of the gate bias. Graph 1410 demonstrates the power added efficiency (PAE) recovery at the low power region in outphasing operation condition with varied bias. Any expected phase mismatch at high power region caused by this gate bias adjustment can be compensated for via tuning of the phase offset line of power amplifier output matching networks. Additionally, any gain mismatch at the high power region caused by gate bias adjustment can be compensated for via adjusting the signal split ratio, using different device sizing, etc.

Figure 15:
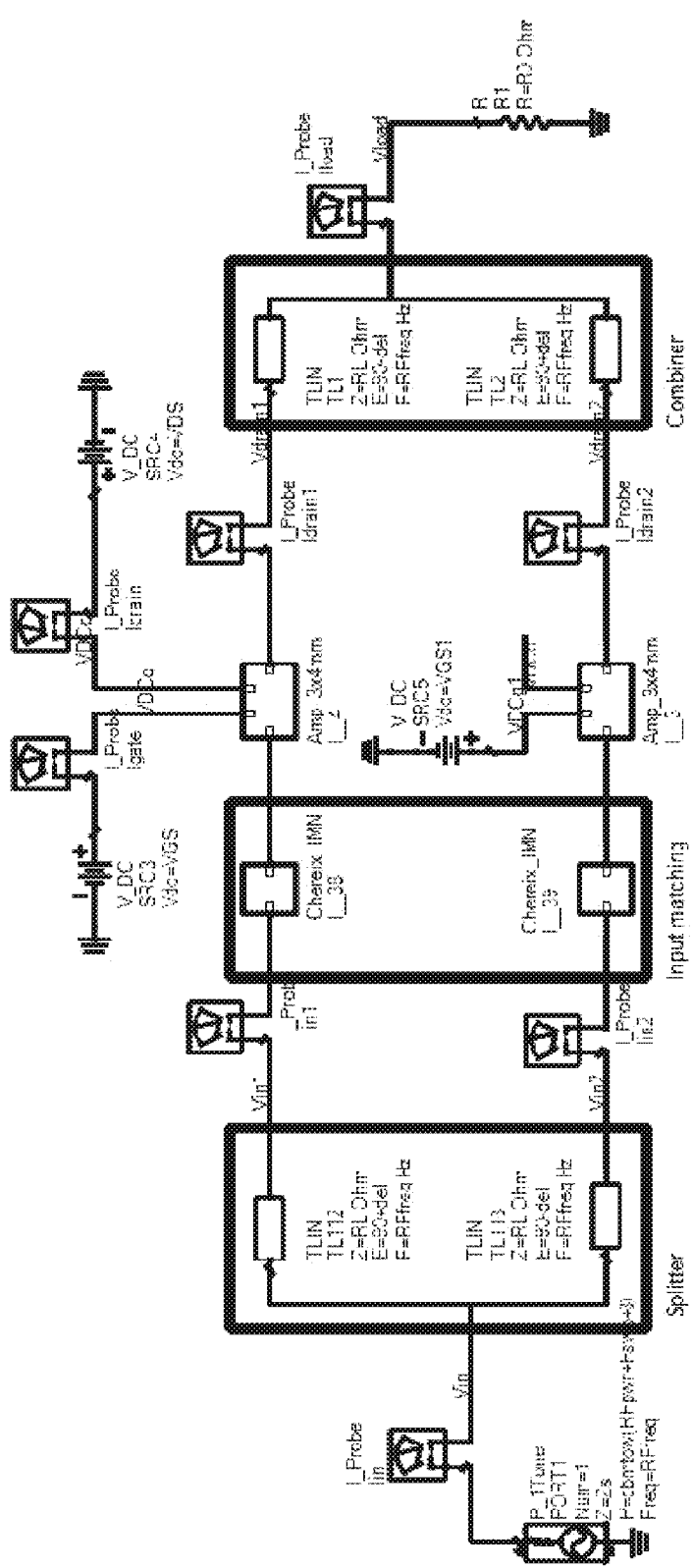
FIG. 15 is an example circuit schematic of an outphasing signal splitter according to various aspects disclosed herein.

Simulations were performed in connection with various example embodiments. An input signal splitter with input matching network was simulated for signal splitting and outphasing operation, using a nonlinear simulator as shown in FIG. 15. FIG. 15 shows a transmission line implementation of a splitter (similar to that of 1310), which is the reverse of the connected output power combiner. Note that the transmission line lengths are switched from the combiner when used as a splitter. The input impedance variation was transformed by the input matching network to provide load variation for signal splitting. Additionally, the two paths have separate gate biases for biasing ($V_{g1}=-3.0V$, $V_{g2}=-3.8V$).

Figure 16:
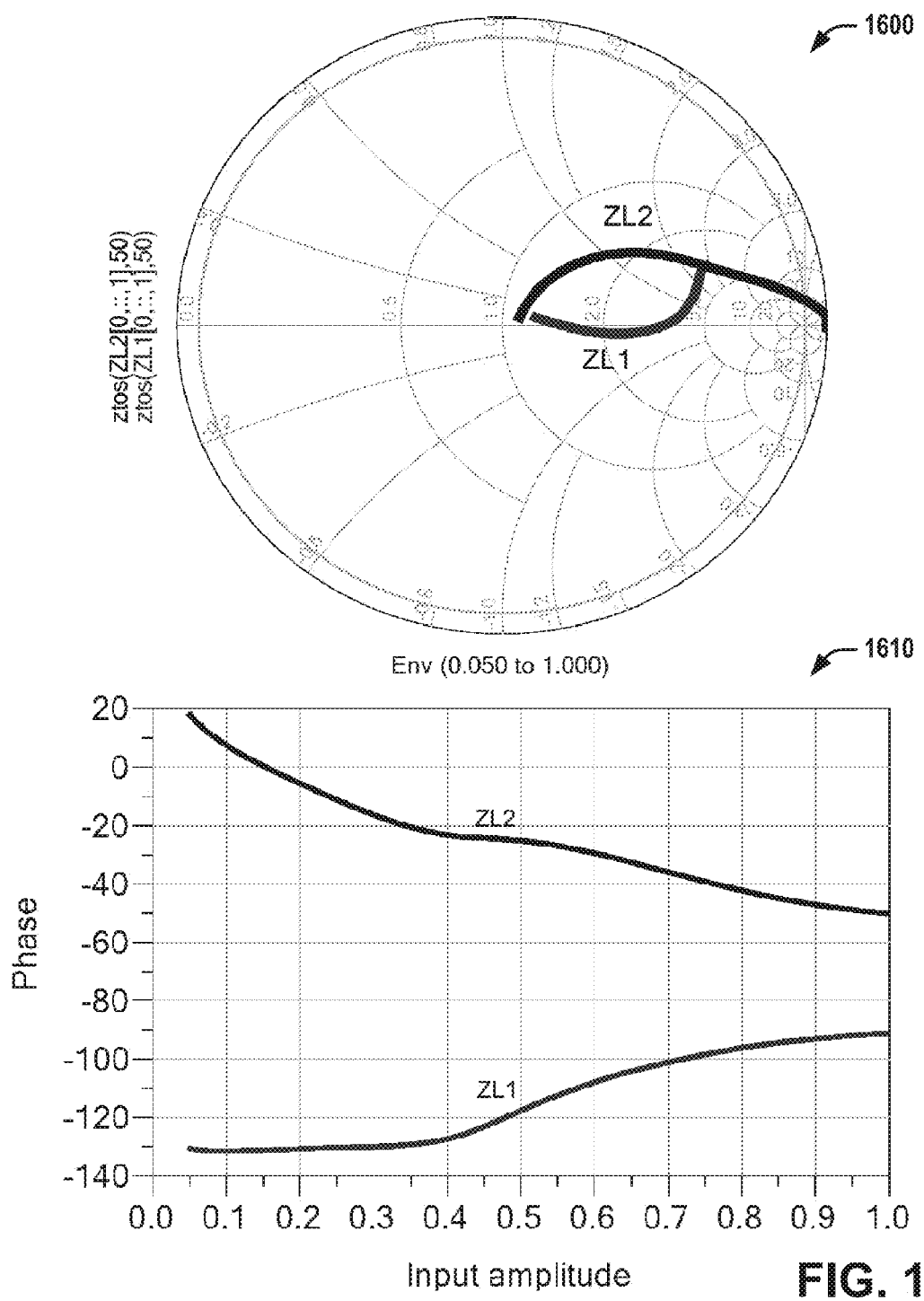
FIG. 16 is a Smith chart showing the load variation at the input of the power combiner in the example embodiment of FIG. 15, and the corresponding phase of the fundamental voltages at the output of the signal splitter.

FIG. 16 shows the simulated load variation at the input of the outphasing combiner, demonstrating the proper outphasing operation when compared to the theoretical load variation of FIG. 8B. Note that when the class-C biased power amplifier is turned off at low power operation, the impedance seen from the class-C biased amplifier goes out of the smith chart as can be seen in curve ZL2 of 1600. The split phases at the output of the signal splitter are shown in 1610 versus input amplitude, showing out-phased signal splitting after the class-C bias amplifier is turned on.

Figure 17:
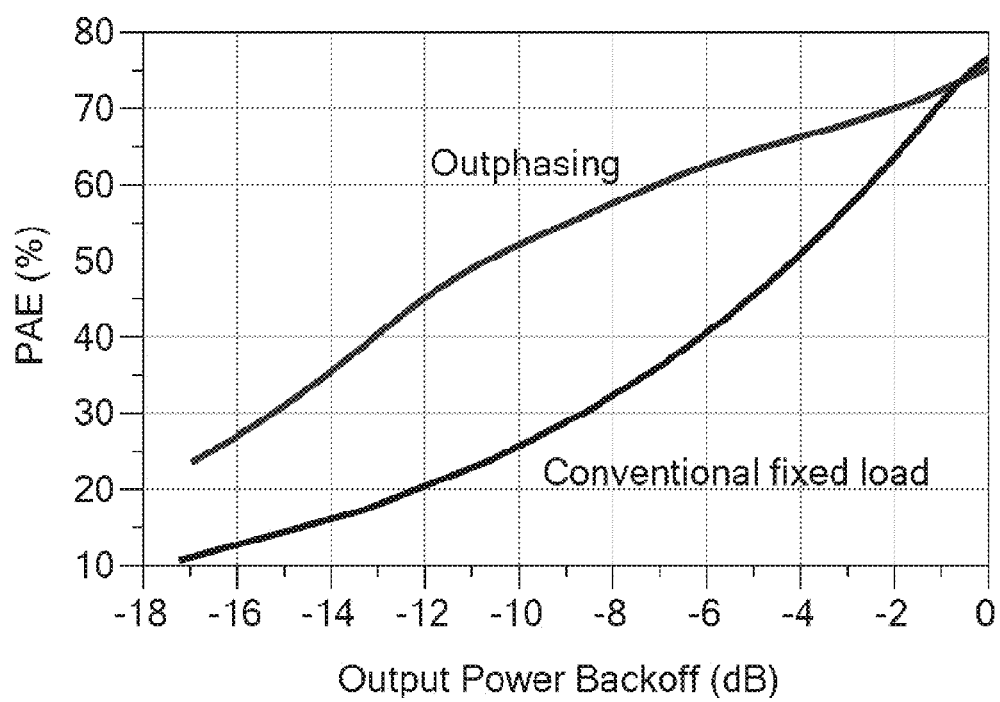
FIG. 17 is a graph showing a comparison between the simulated efficiency of a conventional fixed load amplifier and an outphasing amplifier according to various aspects disclosed herein.

Referring to FIG. 17, illustrated is a graph comparing simulated PAE between a conventional fixed-load power amplifier and an outphasing power amplifier according to various aspects disclosed herein. The outphasing amplifier clearly shows improved efficiency at back-off due to the intended outphasing operation with the signal splitter implemented with input matching network and multiple biasing. Although the example discussed in connection with FIGS. 15-17 relates to a transmission-line only implementation, embodiments employing shunt elements perform similarly.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A system that facilitates power amplification, comprising:
   a signal splitter configured to receive an input data signal and to output a plurality of data signals, wherein the signal splitter shifts each of the plurality of data signals by a distinct phase, wherein the distinct phases are based at least in part on a power of the input data signal;
   a plurality of power amplifiers (PAs), wherein each of the plurality of PAs is configured to amplify a distinct data signal of the plurality of data signals to generate a distinct amplified data signal;
   a plurality of input matching networks, wherein each of the input matching networks is coupled to a distinct PA of the plurality of PAs and is configured to transform an input impedance of the coupled PA to an outphasing load condition based on the distinct data signal the coupled PA is configured to amplify; and
   a combiner configured to combine the plurality of distinct amplified data signals to generate an amplified input data signal.

2. The system of claim 1, wherein at least a first PA of the plurality of PAs has a first bias, and at least a second PA of the plurality of PAs has a second bias distinct from the first bias.

3. The system of claim 2, wherein, in response to the power of the input data signal being below a threshold power, at least the second PA is configured to deactivate or to remain inactive.

4. The system of claim 2, wherein at least the first PA is a class-AB PA, and at least the second PA is a class-C PA.

5. The system of claim 1, wherein the plurality of PAs comprises two PAs.

6. The system of claim 1, wherein the plurality of PAs comprises more than two PAs.

7. The system of claim 1, wherein at least one of the plurality of PAs is a gallium nitride (GaN) PA or a laterally diffused metal oxide semiconductor (LDMOS) PA.

8. The system of claim 1, wherein the signal splitter shifts the plurality of data signals by the distinct phases via a first plurality of shunt reactive elements.

9. The system of claim 1, wherein the signal splitter shifts the plurality of data signals by the distinct phases via a first plurality of disparate transmission lines.

10. The system of claim 1, wherein the combiner combines the plurality of distinct amplified data signals via a second plurality of shunt reactive elements.

11. The system of claim 1, wherein the combiner combines the plurality of distinct amplified data signals via a second plurality of disparate transmission lines.

12. The system of claim 1, wherein the input impedances of the plurality of PAs are determined based at least in part on applying measured combiner input impedances to outputs of the plurality of PAs.

13. A non-transitory machine-readable medium comprising instructions that, when executed, cause a machine to:
    transform input impedances of each PA of a plurality of PAs to an outphasing load condition via an associated input matching network of a plurality of input matching networks;
    split an input data signal into a plurality of data signals, wherein each of the plurality of data signals has a distinct phase that is based at least in part on a power of the input data signal;
    amplify each data signal of the plurality of data signals via a distinct power amplifier (PA) of the plurality of PAs, wherein each distinct PA generates a distinct amplified data signal; and
    combine the plurality of distinct amplified data signals to generate an amplified input data signal.

14. The non-transitory machine-readable medium of claim 13, further comprising determining the input impedances of the plurality of PAs, wherein determining the input impedances comprises:
    measuring combiner input impedances in connection with the outphasing load condition;
    applying the measured combiner input impedances to the outputs of the plurality of PAs; and
    measuring the input impedances of the plurality of PAs based on the applied measured combiner input impedances.

15. The non-transitory machine-readable medium of claim 13, wherein the instructions, when executed, further cause the machine to:
    bias at least a first PA with a first gate bias; and
    bias at least a second PA with a second gate bias distinct from the first gate bias.

16. The non-transitory machine-readable medium of claim 14, wherein the instructions, when executed, further cause the machine to deactivate the at least the second PA in response to the power of the input data signal being below a threshold power.

17. The non-transitory machine-readable medium of claim 13, wherein the input data signal is split via a plurality of shunt reactive elements.

18. The non-transitory machine-readable medium of claim 13, wherein the input data signal is split via a plurality of disparate transmission lines.

19. A system that facilitates power amplification, comprising:
    means for splitting an input data signal into a plurality of data signals, wherein each of the plurality of data signals has a distinct phase, wherein the distinct phases are based at least in part on a power of the input data signal;
    a plurality of means for amplifying, wherein each means for amplifying is configured to amplify a distinct data signal of the plurality of data signals to generate a plurality of distinct amplified data signals;
    a plurality of means for matching, wherein each means for matching transforms an input impedance of a distinct means for amplifying of the plurality of means for amplifying to an outphasing load condition; and
    means for combining the plurality of distinct amplified data signals to generate an amplified input data signal.

20. The system of claim 19, wherein at least a first means for amplifying of the plurality of means for amplifying has a first bias, and at least a second means for amplifying of the plurality of means for amplifying has a second bias distinct from the first bias.

* * * * *